United States Patent
Sung et al.

(10) Patent No.: US 9,041,216 B2
(45) Date of Patent: May 26, 2015

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Su-Jen Sung, Zhubei (TW); Yi-Nien Su, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/922,051

(22) Filed: Jun. 19, 2013

(65) Prior Publication Data
US 2014/0264880 A1  Sep. 18, 2014

Related U.S. Application Data

(60) Provisional application No. 61/783,922, filed on Mar. 14, 2013.

(51) Int. Cl.
*H01L 29/40* (2006.01)
*H01L 21/4763* (2006.01)
*H01L 23/532* (2006.01)
*H01L 21/768* (2006.01)

(52) U.S. Cl.
CPC .... *H01L 23/53295* (2013.01); *H01L 21/76895* (2013.01); *H01L 23/53223* (2013.01); *H01L 23/53238* (2013.01); *H01L 23/53252* (2013.01); *H01L 23/53266* (2013.01); *H01L 23/5329* (2013.01)

(58) Field of Classification Search
USPC .......... 257/750, 758, 773–775, E23.151, 257/E23.175, E21.627, E21.641; 438/627–630, 652–655, 637–639, 438/640–645
See application file for complete search history.

(56) References Cited

U.S. PATENT DOCUMENTS

| | | | | |
|---|---|---|---|---|
| 6,297,162 | B1 * | 10/2001 | Jang et al. | 438/706 |
| 7,241,677 | B2 * | 7/2007 | Soininen et al. | 438/597 |
| 8,399,317 | B2 * | 3/2013 | Ott et al. | 438/197 |
| 2009/0117731 | A1 * | 5/2009 | Yu et al. | 438/627 |

* cited by examiner

*Primary Examiner* — Jasmine Clark
(74) *Attorney, Agent, or Firm* — Slater & Matsil, L.L.P.

(57) ABSTRACT

An interconnect structure and a method of forming an interconnect structure are disclosed. The interconnect structure includes a lower conductive feature in a lower low-k (LK) dielectric layer; a first etch stop layer (ESL) over the lower conductive feature, wherein the first ESL comprises a metal compound; an upper LK dielectric layer over the first ESL; and an upper conductive feature in the upper LK dielectric layer, wherein the upper conductive feature extends through the first ESL and connected to the lower conductive feature. The interconnect structure may further include a second ESL between the upper LK dielectric layer and the first ESL, or between the first ESL and the lower conductive feature, wherein the second ESL comprises a silicon compound.

20 Claims, 6 Drawing Sheets

INTERCONNECT STRUCTURE AND METHOD OF FORMING THE SAME

RELATED CASES

This application claims priority to U.S. Provisional Patent Application No. 61/783,922, filed Mar. 14, 2013, entitled "An Interconnect Structure and Method of Forming the Same," which application is incorporated herein by reference.

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials and extra-low k (ELK) materials that have dielectric constants less than that of silicon dioxide have begun to be implemented in some designs as insulating materials between interconnects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to semiconductor structures, and more particularly, to methods of forming an interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 1:
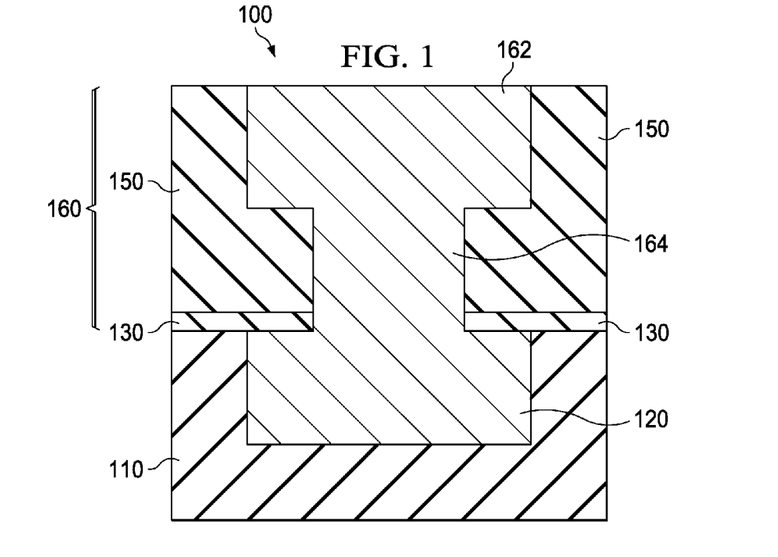
FIGS. 1-3 are cross-sectional views of an interconnect structure 100 according to various aspects of the present disclosure.
Figure 2:
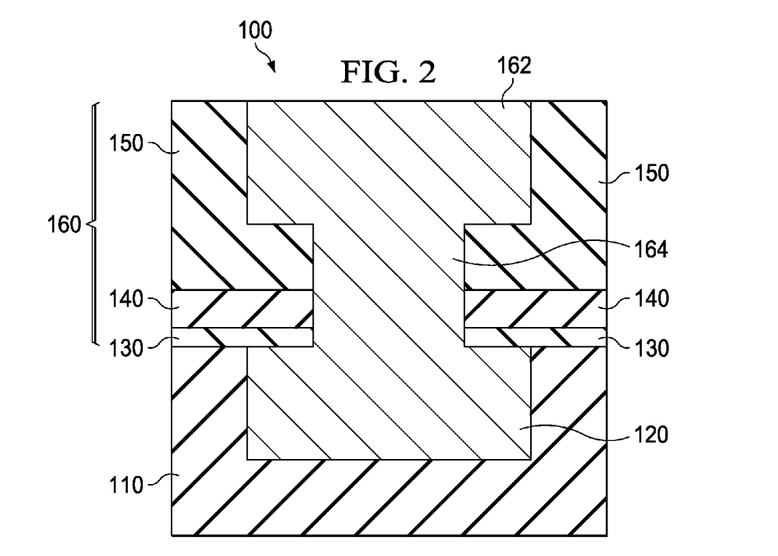
Figure 3:
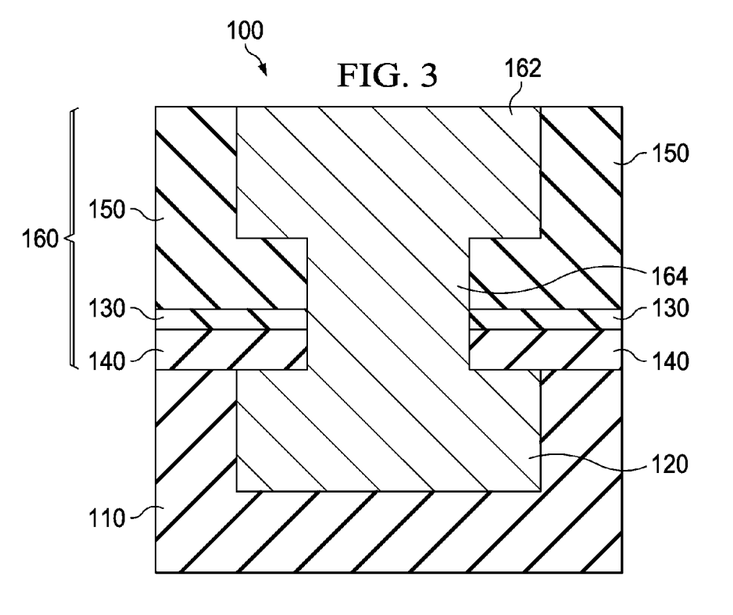

FIGS. 1-3 are cross-sectional views of an interconnect structure 100 according to various aspects of the present disclosure. As depicted in FIG. 1, the interconnect structure 100 comprises a lower conductive feature 120 in a lower low-k (LK) dielectric layer 110; a first etch stop layer (ESL) 130 over the lower conductive feature 120, wherein the first ESL 130 comprises a metal compound; an upper LK dielectric layer 150 over the first ESL 130; and an upper conductive feature 160 in the upper LK dielectric layer 150, wherein the upper conductive feature 160 extends through the first ESL 130 and connected to the lower conductive feature 120. As depicted in FIG. 2, the interconnect structure 100 may further comprise a second ESL 140 between the upper LK dielectric layer 150 and the first ESL 130, wherein the second ESL 140 comprises a silicon compound. As depicted in FIG. 3, the interconnect structure 100 may further comprise a second ESL 140 between the first ESL 130 and the lower conductive feature 120, wherein the second ESL 140 comprises a silicon compound.

A dielectric material of the lower LK dielectric layer 110 or the upper LK dielectric layer 150 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The lower LK dielectric layer 110 or the upper LK dielectric layer 150 may be formed by atomic layer deposition (ALD), chemical vapor deposition (CVD), physical vapor deposition (PVD), or combinations thereof.

The lower conductive feature 120 or the upper conductive feature 160 comprises copper (Cu), aluminum (Al), silver (Ag), gold (Au), tungsten (W), or alloys thereof. The lower conductive feature 120 or the upper conductive feature 160 may also comprise one or more barrier layers selected from a group of W, WN, Ti, Al, TiAl, TiN, TiAlN, Ta, TaC, TaN, TaCN, TaSiN, Mn, Zr, Nb, or Ru. The lower conductive feature 120 or the upper conductive feature 160 may be formed by a process including, but not limited to, ALD, CVD, PVD, sputtering, plating, or combinations thereof. A planarization process, such as a chemical-mechanical planarization/polishing (CMP) process, may be performed to planarize at least one of the upper LK dielectric layer 150 or the upper conductive feature 160. In some embodiments, the lower conductive feature 120 is a metal line. In some embodiments, the upper conductive feature 160 comprises a metal line 162 and a via 164, the via 164 extending through the first ESL 130 and connected to the lower conductive feature 120. In some embodiments, the via 164 may further extend through the second ESL 140.

As mentioned above, the first ESL 130 comprises a metal compound. In some embodiments, the metal compound comprises a metal oxide, a metal nitride, a metal carbide, a metal boride, or a combination of two or more thereof. In some embodiments, the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag). The first ESL 130 may be formed using a suitable process such as ALD, CVD, PVD, molecular beam epitaxy (MBE), spin-on, or combinations thereof. In some embodiments, the first ESL 130 has a thickness in a range from about 10 angstroms (Å) to about 100 angstroms (Å). In other embodiments, the first ESL 130 has a thickness in a range from about 20 Å to about 50 Å. In alternative embodiments, the first ESL 130 has a thickness in a range from about 60 Å to about 90 Å.

The term "dry etch selectivity" used herein refers to the (dry etch rate of the upper LK dielectric layer 150 or the lower LK dielectric layer 110)/(dry etch rate of the first ESL 130 or the second ESL 140). For example, a dry etch selectivity of 10 would result in the upper LK dielectric layer 150 or the lower LK dielectric layer 110 being removed during a dry etching process at a rate that is about 10 times faster than the first ESL 130 or the second ESL 140 is removed during the dry etching process: the dry etch rate ratio is 10/1, which is equal to a dry etch selectivity of about 10. The first ESL 130 is a high selectivity etch stop layer in accordance with some embodiments. For example, the first ESL 130 has a dry etch selectivity to the upper LK dielectric layer 150 of about 10 to about 200.

FIG. 2 is similar to FIG. 1 except that the interconnect structure 100 further comprises the second ESL 140 between the upper LK dielectric layer 150 and the first ESL 130. FIG. 3 is similar to FIG. 1 except that the interconnect structure 100 further comprises the second ESL 140 between the first ESL 130 and the lower conductive feature 120. The second ESL 140 comprises a silicon compound. In some embodiments, the silicon compound comprises a silicon oxide, a silicon nitride, a silicon carbide, a silicon boride, or a combination of two or more thereof. The second ESL 140 may be formed using a suitable process such as ALD, CVD, PVD, MBE, spin-on, or combinations thereof. In some embodiments, the second ESL 140 has a thickness in a range from about 10 Å to about 500 Å. In other embodiments, the second ESL 140 has a thickness in a range from about 50 Å to about 200 Å. In alternative embodiments, the second ESL 140 has a thickness in a range from about 250 Å to about 450 Å.

The second ESL 140 has a different dry etch selectivity to a dielectric layer such as the upper LK dielectric layer 150 or the lower LK dielectric layer 110 from the first ESL 130. In some embodiments, the second ESL 140 has a lower dry etch selectivity to the upper LK dielectric layer 150 or the lower LK dielectric layer 110 than the first ESL 130. In other embodiments, the second ESL 140 has a dry etch selectivity to the upper LK dielectric layer 150 of about 3 to about 15, for example. In alternative embodiments, the second ESL 140 has a dry etch selectivity to the upper LK dielectric layer 150 of about 15 or less, for example.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
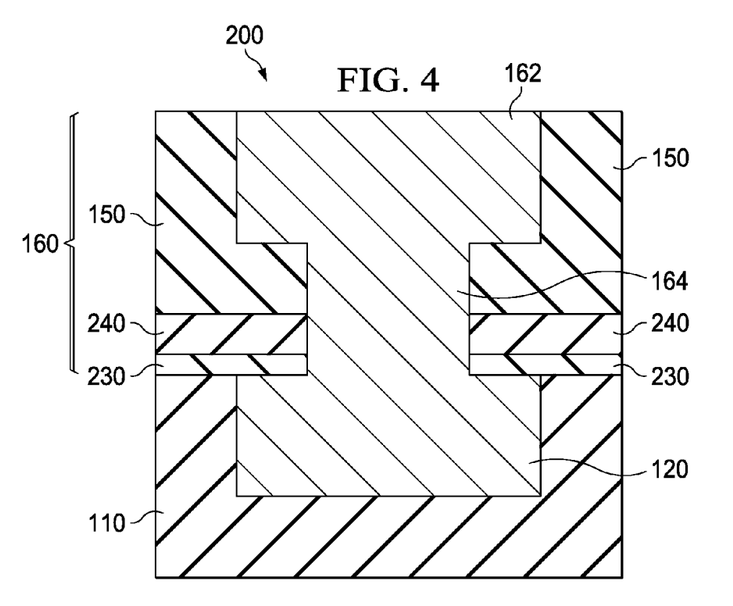
FIG. 4 is a cross-sectional view of a damascene structure 200 according to various aspects of the present disclosure.

FIG. 4 is a cross-sectional view of a damascene structure 200 according to various aspects of the present disclosure. As depicted in FIG. 4, the damascene structure 200 comprises a lower conductive feature 120 in a lower low-k (LK) dielectric layer 110; a first etch stop layer (ESL) 230 over the lower conductive feature 120, wherein the first ESL 230 comprises one of a silicon compound or a metal compound; a second ESL 240 over the first ESL 230, wherein the second ESL 240 comprises the other of the silicon compound or the metal compound; an upper LK dielectric layer 150 over the second ESL 240; and an upper conductive feature 160 in the upper LK dielectric layer 150, wherein the upper conductive feature 160 extends through the first ESL 230 and the second ESL 240 and connected to the lower conductive feature 120. Actually, FIG. 4 is similar to FIG. 2 except that the first ESL 230 in FIG. 4 comprises one of the silicon compound or the metal compound while the first ESL 130 in FIG. 2 comprises the metal compound, and that the second ESL 240 in FIG. 4 comprises the other of the silicon compound or the metal compound while the second ESL 140 in FIG. 2 comprises the silicon compound.

In some embodiments, the metal compound comprises a metal oxide, a metal nitride, a metal carbide, a metal boride, or a combination of two or more thereof. In some embodiments, the metal compound comprises one or more metal elements selected from Ru, Ni, Co, Cr, Fe, Mn, Ti, Al, Hf, Ta, W, V, Mo, Pd, or Ag. One of the first ESL 230 or the second ESL 240 comprising the metal compound may be formed using a suitable process such as ALD, CVD, PVD, MBE, spin-on, or combinations thereof. In some embodiments, one of the first ESL 230 or the second ESL 240 comprising the metal compound has a thickness in a range from about 10 Å to about 100 Å. In other embodiments, one of the first ESL 230 or the second ESL 240 comprising the metal compound has a thickness in a range from about 20 Å to about 50 Å. In alternative embodiments, one of the first ESL 230 or the second ESL 240 comprising the metal compound has a thickness in a range from about 60 Å to about 90 Å.

The term "dry etch selectivity" used herein refers to the (dry etch rate of the upper LK dielectric layer 150 or the lower LK dielectric layer 110)/(dry etch rate of the first ESL 230 or the second ESL 240). For example, a dry etch selectivity of 10 would result in the upper LK dielectric layer 150 or the lower LK dielectric layer 110 being removed during a dry etching process at a rate that is about 10 times faster than the first ESL 230 or the second ESL 240 is removed during the dry etching process: the dry etch rate ratio is 10/1, which is equal to a dry etch selectivity of about 10. One of the first ESL 230 or the second ESL 240 comprising the metal compound is a high selectivity etch stop layer in accordance with some embodiments. For example, one of the first ESL 230 or the second ESL 240 comprising the metal compound has a dry etch selectivity to the upper LK dielectric layer 150 of about 10 to about 200.

In some embodiments, the silicon compound comprises a silicon oxide, a silicon nitride, a silicon carbide, a silicon boride, or a combination of two or more thereof. One of the first ESL 230 or the second ESL 240 comprising the silicon compound may be formed using a suitable process such as ALD, CVD, PVD, MBE, spin-on, or combinations thereof. In some embodiments, one of the first ESL 230 or the second ESL 240 comprising the silicon compound has a thickness in a range from about 10 Å to about 500 Å. In other embodiments, one of the first ESL 230 or the second ESL 240 comprising the silicon compound has a thickness in a range from about 50 Å to about 200 Å. In alternative embodiments, one of the first ESL 230 or the second ESL 240 comprising the silicon compound has a thickness in a range from about 250 Å to about 450 Å.

The second ESL 240 has a different dry etch selectivity to a dielectric layer such as the upper LK dielectric layer 150 or the lower LK dielectric layer 110 from the first ESL 230. One of the first ESL 230 or the second ESL 240 comprising the silicon compound has a lower dry etch selectivity to the upper LK dielectric layer 150 or the lower LK dielectric layer 110 than the other of the first ESL 230 or the second ESL 240. In some embodiments, one of the first ESL 230 or the second ESL 240 comprising the silicon compound has a dry etch selectivity to the upper LK dielectric layer 150 of about 3 to about 15, for example. In other embodiments, one of the first ESL 230 or the second ESL 240 comprising the silicon compound has a dry etch selectivity to the upper LK dielectric layer 150 of about 15 or less, for example.

Figure 5:
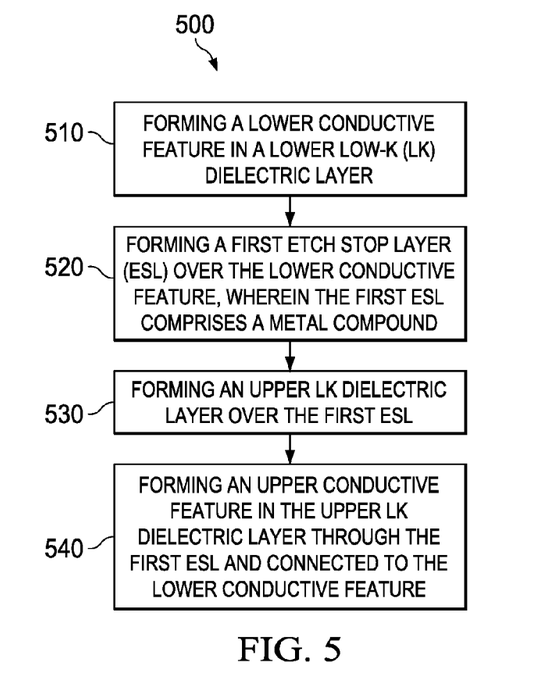
FIG. 5 is a flowchart of a method 500 of forming the interconnect structure 100 according to various aspects of the present disclosure.

FIG. 5 is a flowchart of a method 500 of forming the interconnect structure 100 according to various aspects of the present disclosure. It is understood that additional steps can be provided before, during, and after the method 500, and some of the steps described can be replaced or eliminated for other embodiments of the method 500. The method 500 begins at step 510 in which a lower conductive feature is formed in a lower low-k (LK) dielectric layer. The method 500 continues with step 520 in which a first etch stop layer (ESL) is formed over the lower conductive feature, wherein the first ESL comprises a metal compound. The method 500 continues with step 530 in which an upper LK dielectric layer is formed over the first ESL. The method 500 continues with step 540 in which an upper conductive feature is formed in the upper LK dielectric layer through the first ESL and connected to the lower conductive feature. The method 500 may further comprise forming a second ESL between the upper LK dielectric layer and the first ESL, wherein the second ESL comprises a silicon compound. The method 500 may further comprise forming a second ESL between the first ESL and the lower conductive feature, wherein the second ESL comprises a silicon compound. The discussion that follows illustrates embodiments of the interconnect structure 100 that can be fabricated according to the method 500 of FIG. 5.

Figure 6:
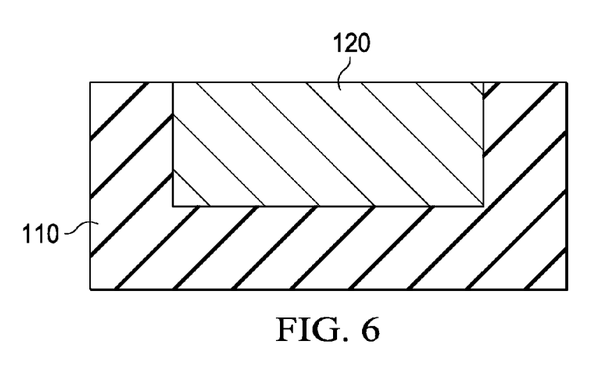
FIGS. 6-12 are cross-sectional views of the interconnect structure 100 at various stages of fabrication according to various aspects of the present disclosure.

FIGS. 6-12 are cross-sectional views of the interconnect structure 100 at various stages of fabrication according to various aspects of the present disclosure. As depicted in FIG. 6 and step 510 in FIG. 5, the method 500 begins at step 510 by forming a lower conductive feature 120 in a lower low-k (LK) dielectric layer 110. The lower conductive feature 120 comprises a conductive line or a conductive plug in some embodiments, for example. In some embodiments, the lower conductive feature 120 is a metal line. The lower conductive feature 120 may be formed using a damascene technique or a subtractive etching technique, as examples. The lower conductive feature 120 may be formed by a process including, but not limited to, ALD, CVD, PVD, sputtering, plating, or combinations thereof. The lower conductive feature 120 comprises Cu, Al, Ag, Au, W, or alloys thereof. The lower conductive feature 120 may also comprise one or more barrier layers selected from a group of W, WN, Ti, Al, TiAl, TiN, TiAlN, Ta, TaC, TaN, TaCN, TaSiN, Mn, Zr, Nb, or Ru. Alternatively, the lower conductive feature 120 may comprise other materials and may be formed using other methods.

Figure 7:
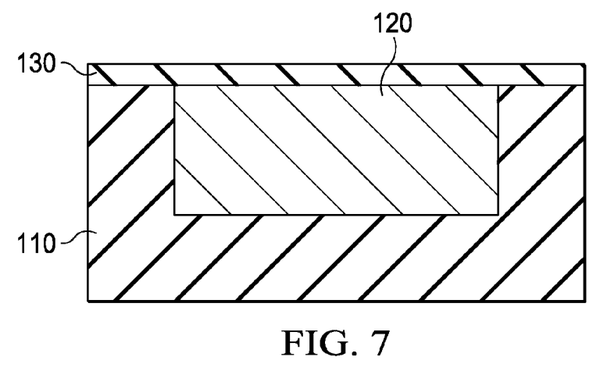

As depicted in FIG. 7 and step 520 in FIG. 5, the method 500 continues with step 520 by forming a first etch stop layer (ESL) 130 over the lower conductive feature 120, wherein the first ESL 130 comprises a metal compound. The first ESL 130 may be formed using a suitable process such as ALD, CVD, PVD, MBE, spin-on, or combinations thereof. In some embodiments, the metal compound comprises a metal oxide, a metal nitride, a metal carbide, a metal boride, or a combination of two or more thereof. In some embodiments, the metal compound comprises one or more metal elements selected from Ru, Ni, Co, Cr, Fe, Mn, Ti, Al, Hf, Ta, W, V, Mo, Pd, or Ag. In some embodiments, the first ESL 130 has a thickness in a range from about 10 Å to about 100 Å. In other embodiments, the first ESL 130 has a thickness in a range from about 20 Å to about 50 Å. In alternative embodiments, the first ESL 130 has a thickness in a range from about 60 Å to about 90 Å. The first ESL 130 is a high selectivity etch stop layer in accordance with some embodiments. For example, the first ESL 130 has a dry etch selectivity to the upper LK dielectric layer 150 of about 10 to about 200.

Figure 8:
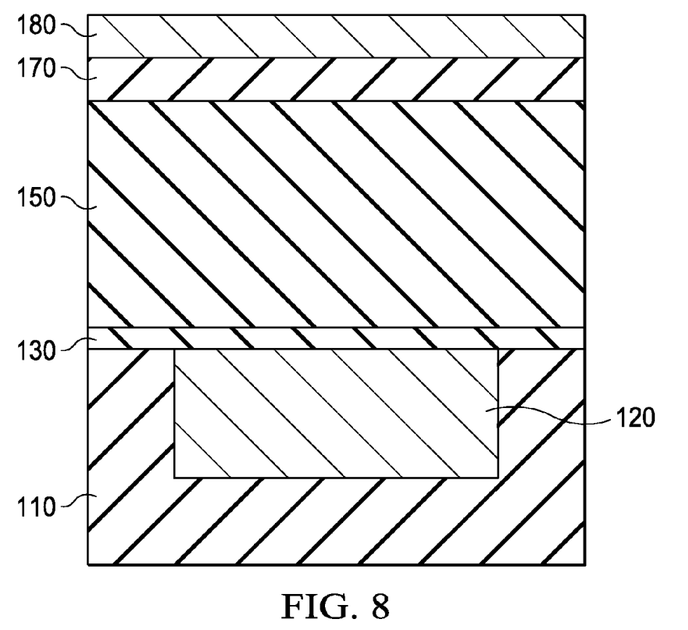

As depicted in FIG. 8 and step 530 in FIG. 5, the method 500 continues with step 530 by forming an upper LK dielectric layer 150 over the first ESL 130. The lower LK dielectric layer 110 or the upper LK dielectric layer 150 may be formed by ALD, CVD, PVD, or combinations thereof. A dielectric material of the lower LK dielectric layer 110 or the upper LK dielectric layer 150 comprises an oxide, $SiO_2$, SiOCH, BPSG, TEOS, SOG, USG, FSG, HDP oxide, PETEOS, fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8.

The method 500 may further comprises forming a second ESL (not shown hereinafter) between the upper LK dielectric layer 150 and the first ESL 130, wherein the second ESL comprises a silicon compound. The method 500 may further comprises forming a second ESL (not shown hereinafter) between the first ESL 130 and the lower conductive feature 120, wherein the second ESL comprises a silicon compound. The second ESL may be formed using a suitable process such as ALD, CVD, PVD, MBE, spin-on, or combinations thereof.

In some embodiments, the silicon compound comprises a silicon oxide, a silicon nitride, a silicon carbide, a silicon boride, or a combination of two or more thereof. In some embodiments, the second ESL has a thickness in a range from about 10 Å to about 500 Å. In other embodiments, the second ESL has a thickness in a range from about 50 Å to about 200 Å. In alternative embodiments, the second ESL has a thickness in a range from about 250 Å to about 450 Å. The second ESL has a different dry etch selectivity to a dielectric layer such as the upper LK dielectric layer 150 or the lower LK dielectric layer 110 from the first ESL 130. In some embodiments, the second ESL has a lower dry etch selectivity to the upper LK dielectric layer 150 or the lower LK dielectric layer 110 than the first ESL 130. In other embodiments, the second ESL has a dry etch selectivity to the upper LK dielectric layer 150 of about 3 to about 15, for example. In alternative embodiments, the second ESL has a dry etch selectivity to the upper LK dielectric layer 150 of about 15 or less, for example.

As depicted in FIG. 8, the method 500 may further comprise forming a dielectric hard mask layer 170 over the upper LK dielectric layer 150, and forming a metal hard mask layer 180 over the dielectric hard mask layer 170. The dielectric hard mask layer 170 or the metal hard mask layer 180 may be deposited using an ALD, CVD, PVD process, or combinations thereof. In some embodiments, the dielectric hard mask layer 170 includes a dielectric material, such as silicon oxide, silicon nitride, silicon oxynitride, or other suitable materials. In some embodiments, the metal hard mask layer 180 includes a metal nitride compound different from the first ESL 130, such as TiN.

Figure 9:
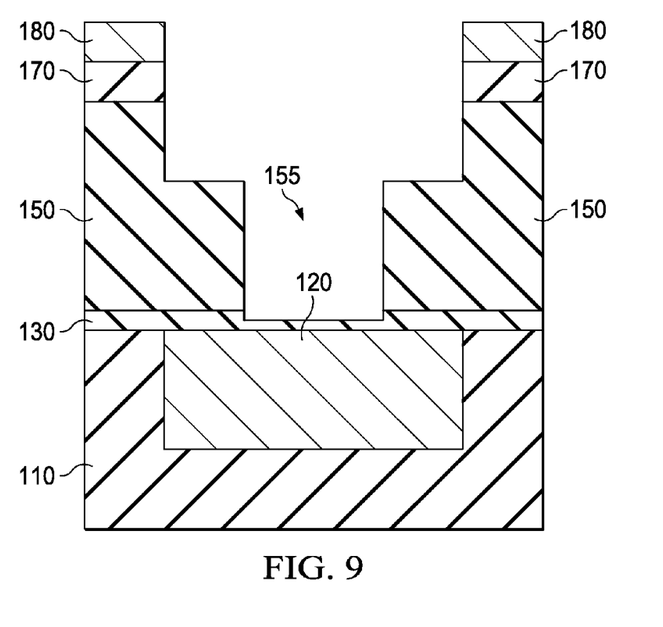

As depicted in FIGS. 9-12 and FIG. 1, and step 540 in FIG. 5, the method 500 continues with step 540 by forming an upper conductive feature 160 in the upper LK dielectric layer 150 through the first ESL 130 and connected to the lower conductive feature 120. As depicted in FIG. 9, step 540 comprises forming an opening 155 in the upper LK dielectric layer 150 over the first ESL 130 or the second ESL (not shown). The opening 155 may include a trench and/or a via plug hole. The opening 155 is formed by a photolithography process (e.g., patterning the metal hard mask layer 180 and the dielectric hard mask layer 170 first) followed by a dry etching process containing plasma. The dry etching process may be a single step or a multiple step etching process. The dry etching process may be an anisotropic etching process. The dry etching process may use reactive ion etch (RIE) and/or other suitable process. In one example, a dry etching process is used to etch the upper LK dielectric layer 150 that includes a chemistry including fluorine-containing gas. As mentioned above, the first ESL 130 is a high selectivity etch stop layer in accordance with some embodiments, and the second ESL has a different dry etch selectivity to a dielectric layer from the first ESL 130. For example, the first ESL 130 has a dry etch selectivity to the upper LK dielectric layer 150 of about 10 to about 200, and the second ESL has a dry etch selectivity to the upper LK dielectric layer 150 of about 15 or less. In some embodiments, the dry etching process may cause some loss of the first ESL 130 but will not penetrate through it. In other embodiments, the dry etching process may penetrate through the second ESL but stop on the first ESL 130. In alternative embodiments, the dry etching process may penetrate through the first ESL 130 but stop on the second ESL.

Figure 10:
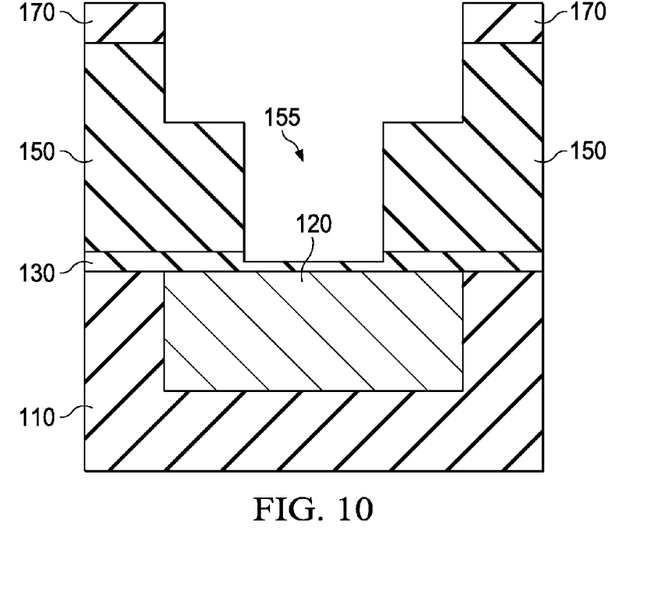

As depicted in FIG. 10, step 540 comprises removing the metal hard mask layer 180 by a wet etching process. The first ESL 130 or the second ESL has a high wet etch selectivity to the metal hard mask layer 180. The term "wet etch selectivity" used herein refers to the (wet etch rate of the metal hard mask layer 180)/(wet etch rate of the first ESL 130 or the second ESL). For example, a wet etch selectivity of 10 would result in the metal hard mask layer 180 being removed during a wet etching process at a rate that is about 10 times faster than the first ESL 130 or the second ESL is removed during the wet etching process: the wet etch rate ratio is 10/1, which is equal to a wet etch selectivity of about 10. Therefore, when the metal hard mask layer 180 is being removed during the wet etching process, the first ESL 130 or the second ESL can protect the lower conductive feature 120 from being damaged by the wet etching process.

Figure 11:
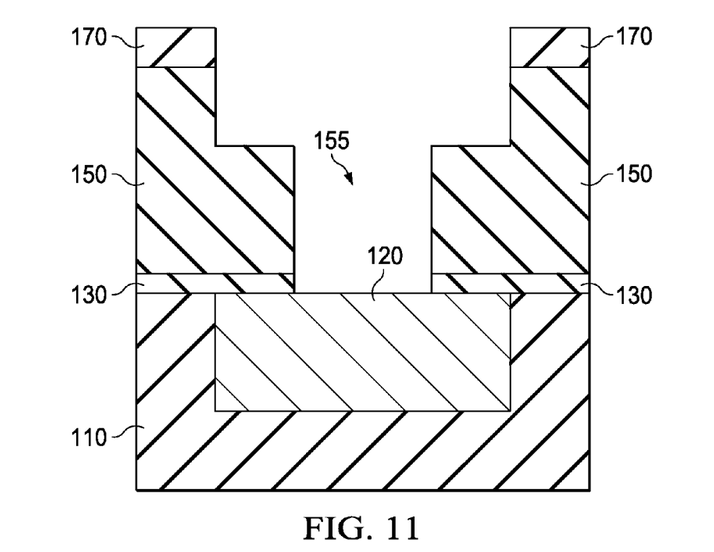

As depicted in FIG. 11, step 540 comprises forming the opening 155 through the first ESL 130 or the second ESL by a second dry etching process. The first ESL 130 or the second ESL has a low "second dry etch selectivity" to the dielectric hard mask layer 170 or the upper LK dielectric layer 150. The term "second dry etch selectivity" used herein refers to the (dry etch rate of the dielectric hard mask layer 170 or the upper LK dielectric layer 150)/(dry etch rate of the first ESL 130 or the second ESL). For example, a second dry etch selectivity of 0.1 would result in the dielectric hard mask layer 170 or the upper LK dielectric layer 150 being removed during the second dry etching process at a rate that is about one tenth time slower than the first ESL 130 or the second ESL is removed during the second dry etching process: the second dry etch rate ratio is 1/10, which is equal to a second dry etch selectivity of about 0.1. For example, the first ESL 130 or the second ESL has second dry etch selectivity to the dielectric hard mask layer 170 or the upper LK dielectric layer 150 of about 0.005 to about 0.1.

The second dry etch selectivity is different from the dry etch selectivity mentioned above. In general, there are two possible components to any approach to adjusting the dry etch selectivity or the second dry etch selectivity, chemical and physical. The chemical component involves making use of the influence of chemically different ions and neutral species in the plasma, by changing the gas mixture or operating conditions to adjust selectivity. The physical component involves controlling the bombardment of the underlying material by energetic ions. In some embodiments, more physical component than chemical component may lead to a lower dry etch selectivity.

Figure 12:
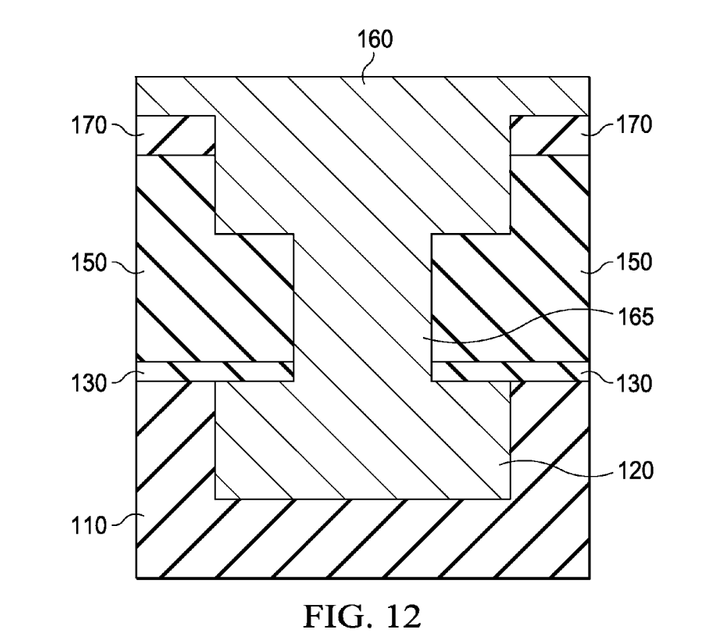

As depicted in FIG. 12, step 540 comprises forming a metal layer 165 in the opening 155 through the first ESL 130 and connected to the lower conductive feature 120. The metal layer 165 may be formed by a process including, but not limited to, ALD, CVD, PVD, sputtering, plating, or combinations thereof. The metal layer 165 comprises Cu, Al, Ag, Au, or alloys thereof. The metal layer 165 may also comprise one or more barrier layers selected from a group of W, WN, Ti, Al, TiAl, TiN, TiAlN, Ta, TaC, TaN, TaCN, TaSiN, Mn, Zr, Nb, or Ru. As depicted in FIG. 1, step 540 comprises performing CMP on at least one of the upper LK dielectric layer 150 or the metal layer 165 to form the upper conductive feature 160 in the upper LK dielectric layer 150.

The method 500 may further comprise forming an upper ESL (not shown) over the upper LK dielectric layer 150 and the upper conductive feature 160. The upper ESL may be formed using a suitable process such as ALD, CVD, PVD, MBE, spin-on, or combinations thereof. In some embodiments, the upper ESL comprises one of a silicon compound or a metal compound. In some embodiments, the metal compound comprises one or more metal elements selected from Ru, Ni, Co, Cr, Fe, Mn, Ti, Al, Hf, Ta, W, V, Mo, Pd, or Ag. The upper ESL comprising the metal compound has a thickness in a range from about 10 Å to about 100 Å. In some embodiments, the silicon compound comprises a silicon oxide, a silicon nitride, a silicon carbide, a silicon boride, or a combination of two or more thereof. The upper ESL comprising the silicon compound has a thickness in a range from about 10 Å to about 500 Å.

The methods of the present disclosure are not limited to be used by a planar device on the substrate and can be applied to a non-planar device as well, such as a fin-like field effect transistor (FinFET) or a nanowire transistor. Based on the discussions above, it can be seen that by using the methods of the present disclosure, a lower conductive feature such a metal line is protected by a first etch stop layer (ESL) and/or a second ESL during a wet etching process, which prevents the lower conductive feature from being damaged by the wet etching process in the fabrication of an interconnect structure. Therefore, void formation in the lower conductive feature can be well controlled and avoided.

One of the broader forms of the present disclosure involves an interconnect structure. The interconnect structure comprises a lower conductive feature in a lower low-k (LK) dielectric layer; a first etch stop layer (ESL) over the lower conductive feature, wherein the first ESL comprises a metal compound; an upper LK dielectric layer over the first ESL; and an upper conductive feature in the upper LK dielectric layer, wherein the upper conductive feature extends through the first ESL and connected to the lower conductive feature.

Another of the broader forms of the present disclosure involves a damascene structure. The damascene structure comprises a lower conductive feature in a lower low-k (LK) dielectric layer; a first etch stop layer (ESL) over the lower conductive feature, wherein the first ESL comprises one of a silicon compound or a metal compound; a second ESL over the first ESL, wherein the second ESL comprises the other of the silicon compound or the metal compound; an upper LK dielectric layer over the second ESL; and an upper conductive feature in the upper LK dielectric layer, wherein the upper conductive feature extends through the first ESL and the second ESL and connected to the lower conductive feature.

Still another of the broader forms of the present disclosure involves a method of forming an interconnect structure. The method comprises forming a lower conductive feature in a lower low-k (LK) dielectric layer; forming a first etch stop layer (ESL) over the lower conductive feature, wherein the first ESL comprises a metal compound; forming an upper LK dielectric layer over the first ESL; and forming an upper conductive feature in the upper LK dielectric layer through the first ESL and connected to the lower conductive feature.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An interconnect structure, comprising:
    a lower conductive feature in a lower low-k (LK) dielectric layer, the lower LK dielectric layer having a substantially planar top surface;
    a first etch stop layer (ESL) over the lower conductive feature, the ESL in contact with and on the substantially planar top surface of the lower LK dielectric layer, wherein the first ESL comprises a metal compound;
    an upper LK dielectric layer over the first ESL; and
    an upper conductive feature in the upper LK dielectric layer, wherein the upper conductive feature extends through the first ESL and connected to the lower conductive feature.

2. The interconnect structure of claim 1, wherein the metal compound comprises a metal oxide, a metal nitride, a metal carbide, a metal boride, or a combination of two or more thereof.

3. The interconnect structure of claim 1, wherein the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag).

4. The interconnect structure of claim 1, wherein the first ESL has a thickness in a range from about 10 angstroms (Å) to about 100 angstroms (Å).

5. The interconnect structure of claim 1, wherein the lower conductive feature is a metal line.

6. The interconnect structure of claim 1, wherein the upper conductive feature comprises a metal line and a via, the via extending through the first ESL and connected to the lower conductive feature.

7. The interconnect structure of claim 1, further comprising a second ESL between the upper LK dielectric layer and the first ESL, wherein the second ESL comprises a silicon compound.

8. The interconnect structure of claim 7, wherein the silicon compound comprises a silicon oxide, a silicon nitride, a silicon carbide, a silicon boride, or a combination of two or more thereof.

9. The interconnect structure of claim 7, wherein the second ESL has a thickness in a range from about 10 angstroms (Å) to about 500 angstroms (Å).

10. The interconnect structure of claim 1, further comprising a second ESL between the first ESL and the lower conductive feature, wherein the second ESL comprises a silicon compound.

11. The interconnect structure of claim 10, wherein the silicon compound comprises a silicon oxide, a silicon nitride, a silicon carbide, a silicon boride, or a combination of two or more thereof.

12. The interconnect structure of claim 10, wherein the second ESL has a thickness in a range from about 10 angstroms (Å) to about 500 angstroms (Å).

13. A damascene structure, comprising:
    a lower conductive feature in a lower low-k (LK) dielectric layer;
    a first etch stop layer (ESL) over the lower conductive feature, wherein the first ESL comprises one of a silicon compound or a metal compound;
    a second ESL over the first ESL, wherein the second ESL comprises the other of the silicon compound or the metal compound;
    an upper LK dielectric layer over the second ESL; and
    an upper conductive feature in the upper LK dielectric layer, wherein the upper conductive feature extends through the first ESL and the second ESL and connected to the lower conductive feature.

14. The damascene structure of claim 13, wherein the silicon compound comprises a silicon oxide, a silicon nitride, a silicon carbide, a silicon boride, or a combination of two or more thereof.

15. The damascene structure of claim 13, wherein the metal compound comprises a metal oxide, a metal nitride, a metal carbide, a metal boride, or a combination of two or more thereof.

16. The damascene structure of claim 13, wherein the metal compound comprises one or more metal elements selected from ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), or silver (Ag).

17. The damascene structure of claim 13, wherein one of the first ESL or the second ESL comprising the silicon compound has a thickness in a range from about 10 angstroms (Å) to about 500 angstroms (Å).

18. The damascene structure of claim 13, wherein one of the first ESL or the second ESL comprising the metal compound has a thickness in a range from about 10 angstroms (Å) to about 100 angstroms (Å).

19. The damascene structure of claim 13, wherein the upper conductive feature comprises a metal line and a via, the via extending through the first ESL and the second ESL and connected to the lower conductive feature.

20. A method of forming an interconnect structure, comprising:
   forming in a lower low-k (LK) dielectric layer a trench having sidewalls and a floor;
   forming a lower conductive feature on the floor of the trench;
   forming a first etch stop layer (ESL) over the lower conductive feature, wherein the first ESL comprises a metal compound;
   forming an upper LK dielectric layer over the first ESL; and
   forming an upper conductive feature in the upper LK dielectric layer through the first ESL and connected to the lower conductive feature.

* * * * *